United States Patent [19]

Ogura

[11] Patent Number: 4,959,681
[45] Date of Patent: Sep. 25, 1990

[54] IMAGE FORMING APPARATUS
[75] Inventor: Mitsuru Ogura, Nara, Japan
[73] Assignee: Sharp Kabushiki Kaisha, Osaka, Japan
[21] Appl. No.: 282,327
[22] Filed: Dec. 9, 1988
[30] Foreign Application Priority Data
  Dec. 14, 1987 [JP] Japan .................. 62-317218
[51] Int. Cl.⁵ .............................. G03B 27/32
[52] U.S. Cl. .................................. 355/27
[58] Field of Search ............. 355/27, 28, 50, 55, 355/72, 233, 234, 235, 212; 430/138

[56] References Cited
U.S. PATENT DOCUMENTS

| 4,399,209 | 8/1983 | Sanders et al. | 430/138 |
| 4,624,560 | 11/1986 | Beery | 355/27 |
| 4,714,943 | 12/1987 | Sakakibara et al. | 355/27 |
| 4,777,513 | 10/1988 | Nelson | 355/27 |

FOREIGN PATENT DOCUMENTS
59-30537 2/1984 Japan .

Primary Examiner—Michael L. Gellner
Assistant Examiner—Khanh Dang

[57] ABSTRACT

In an image forming apparatus according to the present invention, the scanning operation of an original can be controlled independently from the pressing transferring operation of an image of an original, so that both the scanning speed and the pressing-transferring speed can be adjusted respectively at the optimum speed. Moreover, the suspension roller for suspending a photoreceptive sheet has a common driving source with the optical system, it is advantageous that no special driving means or no special synchronizing means for the suspension roller is needed, and manufacturing cost can be reduced with a simple easy design.

7 Claims, 5 Drawing Sheets

IMAGE FORMING APPARATUS

BACKGROUND OF THE INVENTION

1. Field of the Invention

The present invention relates to an image forming apparatus which is arranged to form a developed color image on an image receiving sheet coated with a developing material, and uses a photoreceptive sheet coated with microcapsules in which colorless dyes and photo-hardening agents such as photo-polymerization monomers are sealed. The image is formed through an image-making and exposing process, and a pressing process.

2. Description of the Prior Art

Japanese Patent Laid-open Publication, Tokkaisho No. 58-88739 (88739/1983), discloses one example of an image forming method. The disclosed method is such that a selective hardened image is formed through an image-making and exposing process onto a photoreceptive sheet coated with microcapsules in which colorless dyes and photo-hardening agents are sealed. The photoreceptive sheet is overlapped with an image receiving sheet coated with a developing material to be pressed, thereby to form a developed color image on the image receiving sheet. More specifically, when an image of an original is exposed onto the photoreceptive sheet (that is, subjected to an image-making exposure), photo-hardening agents on the photoreceptive sheet incident upon by the light are hardened; that is, microcapsules incident upon by the light are hardened. Accordingly, a a selective hardened image as a whole is formed. Thereafter, when an image receiving sheet coated with a developing material is overlapped onto the photoreceptive sheet to be pressed, the microcapsules which have not been hardened are broken, resulting in an outflow of the colorless dyes from the microcapsules. Subsequently, the colorless dyes flown outside the microcapsules and the developing material on the image receiving sheet react each other, thereby forming a developed color image.

On the other hand, in another color image forming method, as disclosed in Japanese Patent Laid-open Publication Tokkaisho No. 59-30537 (30537/1984). a selective hardened image is formed through an image-making exposure onto a photoreceptive sheet coated with three kinds of microcapsules each containing photo-hardening agents and one of three color materials, namely, yellow, magenta and cyan. Then, an image receiving sheet coated with a developing material is laid onto the photoreceptive sheet to be pressed, so that a developed color image is formed on the image receiving sheet. When an image of a colored original is exposed onto the photoreceptive sheet (subjected to an image-making exposure), microcapsules are selectively hardened in accordance with the wavelength of the projected light. Then, when an image receiving sheet coated with a developing material is put onto the photoreceptive sheet and pressed, the microcapsules which have not been hardened are broken and consequently the colorless dyes in the microcapsules which become cyan, magenta or yellow flow out of the microcapsules. As a result, the colorless dyes and the developing material on the image receiving sheet react each other, thereby to form a colored image.

In the above-described conventional methods, since the optimum speed in the image-making exposure process does not always agree with the optimum speed in the pressing and transferring process of a pair of pressing rollers, such drawbacks cannot be solved without having the white portions becoming fogged, or the developed color image becoming too dark if the image-making exposure speed is arranged to be the same speed in the pressing and transferring process.

In general, a good image can be formed by arranging the optimum pressing and transferring speed faster than the optimum image-making exposure speed.

SUMMARY OF THE INVENTION

Accordingly, an essential object of the present invention is to provide an image forming apparatus in which the image-making exposure speed and the pressing and transferring speed can be set at their respective optimum speed, so that a good image can be formed.

In accomplishing the above-described object, according to the present invention, an image forming apparatus forms a developed color image on an image receiving sheet coated with a developing material by using a photoreceptive sheet coated with microcapsules containing colorless dyes and photo-hardening agents, through an image-making and exposing process of the photo-receptive sheet and a pressing and transferring process. The present invention includes original scanning means which is movable so as to scan an image of a static original onto the photoreceptive sheet; a suspension means, provided between an image-making exposure unit and a pressing and transferring unit, which is movable in a direction to support the photoreceptive sheet; and driving means for moving the original scanning means and the suspension means.

In the image forming apparatus having the above-described construction, a selective hardened image is formed during the image-making and exposure process acting upon a photo sheet coated with microcapsules containing color source material as an image making a namely, colorless dyes and photo-hardening agents. This apparatus also utilizes the image receiving sheet coated with a developing material which is laid onto the photoreceptive sheet to be pressed. The pressing and transferring speed is arranged to be controlled separately from the image-making and exposing speed.

Consequently, it becomes possible to set the pressing and transferring speed and the image-making exposure speed at their respective optimum speed, so that the generation of fogs and/or muddy colors can be reduced, and a good image achieved.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DETAILED DESCRIPTION OF THE INVENTION

Figure 1:
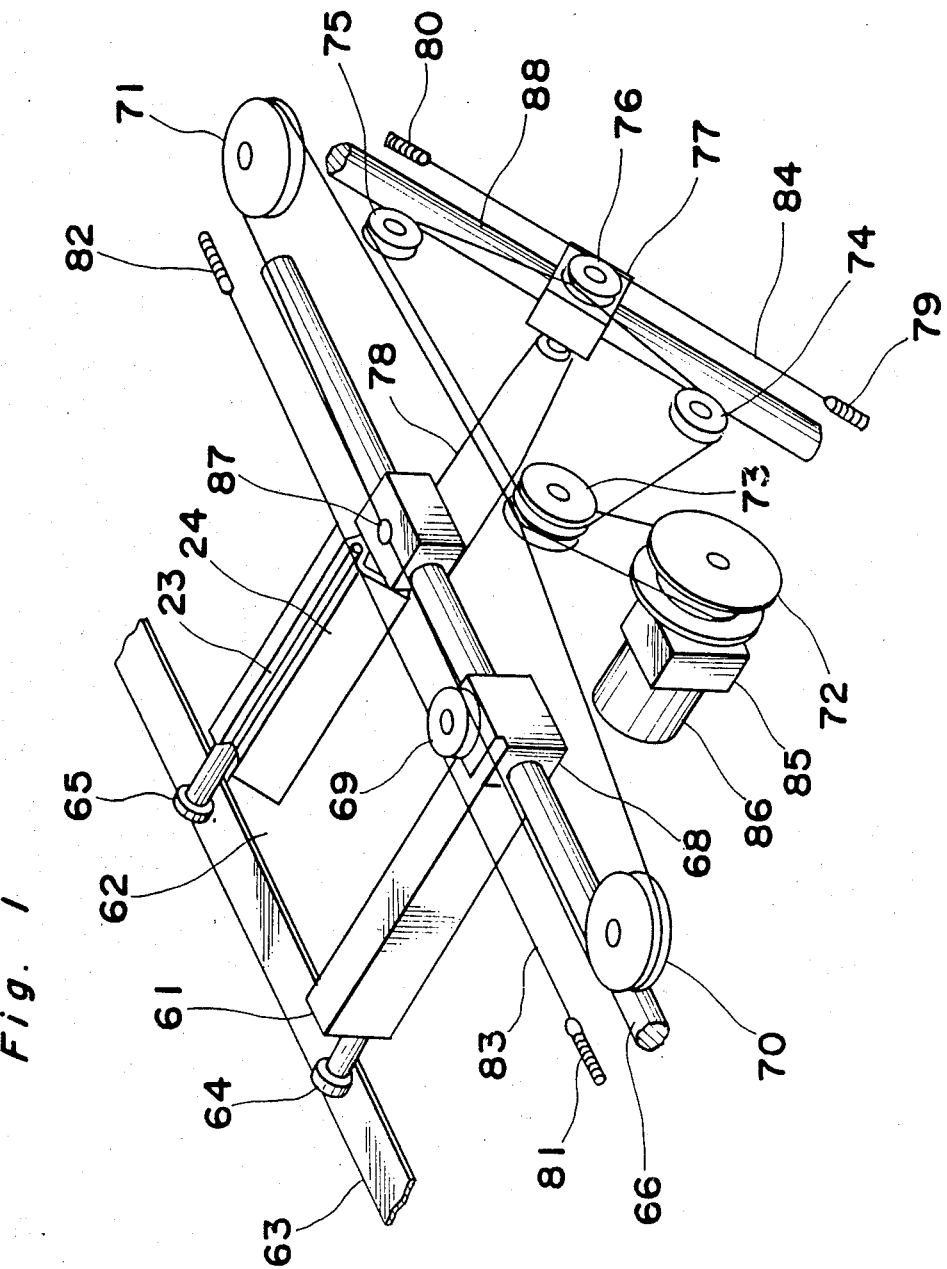
FIG. 1 is a perspective view of an optical system of an image forming apparatus according to the present invention.

Before the description of the present invention proceeds, it is to be noted that like parts are designated by like reference numerals throughout the accompanying drawings.

Figure 2:
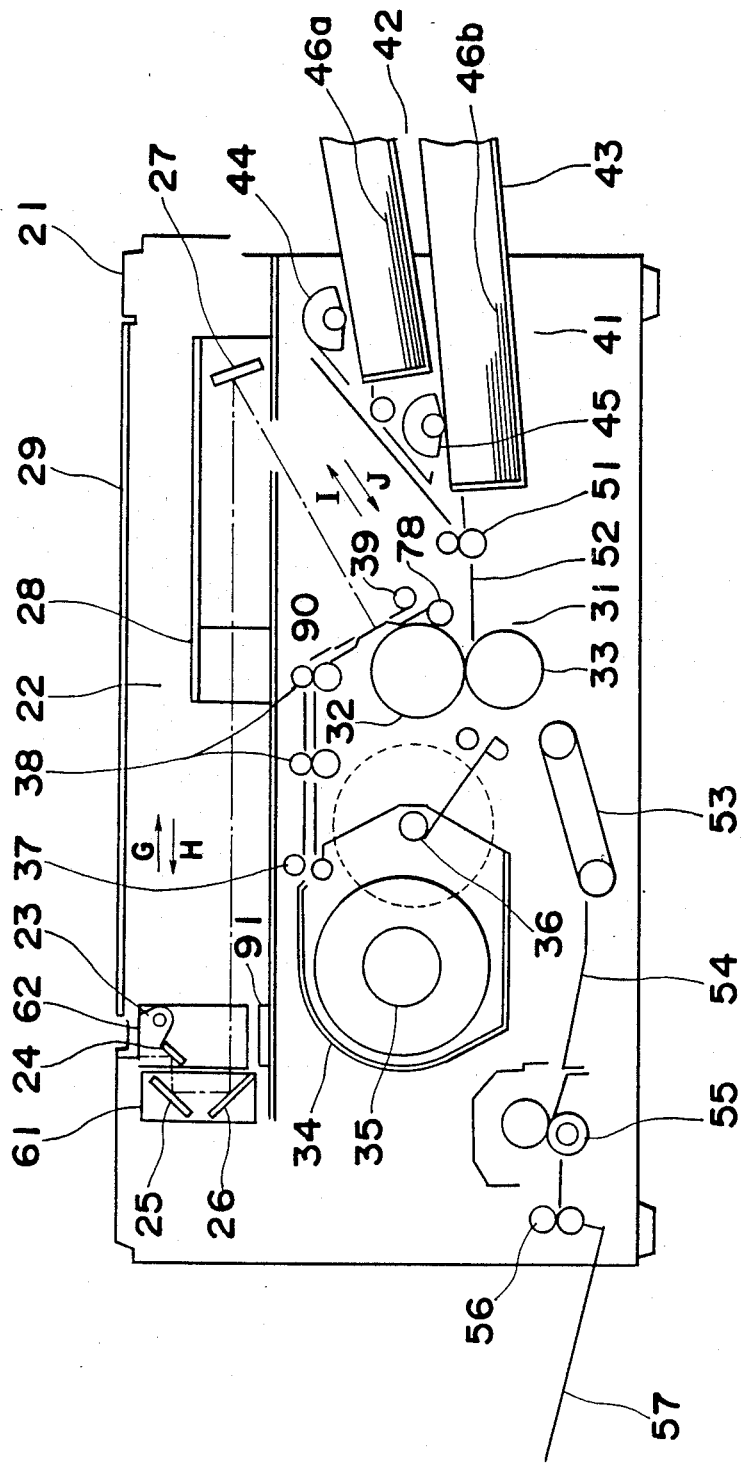
FIG. 2 is a schematic view showing the structure of the image forming apparatus according to the present invention.

In FIG. 2, the structure of an image forming apparatus according to one preferred embodiment of the present invention is shown. The image forming apparatus of the present invention employs the above-referred photoreceptive sheet as a photosensitive sheet.

A platform 29 for placing an original thereon is provided above a main body 21 of the image forming apparatus. The image forming apparatus is provided with an optical system 22 comprised of a light source 23, mirrors 24–27 and a lens 28 below the platform 29 which is made of a transparent hard glass. The light source 23 and mirrors 24–26 of the optical system 22 are moved below the platform 29 in G or H direction shown by an arrow so as to scan an image of an original placed on the platform 29.

An upper pressing roller 32 and a lower pressing roller 33 which are in contact with each other at their respective peripheral surfaces are provided in the central part inside the main body 21, forming a pressing unit 31. There are a supply shaft 35 and a wind-up shaft 36 provided at the left side of the upper pressing roller 32. The supply shaft 35 has a roll of photoreceptive sheets 34 wound around the outer periphery thereof The photoreceptive sheet 34 is coated with microcapsules in which colorless dyes and photohardening agents are sealed. However, the microcapsules are not found for a predetermined length from the front end of the photoreceptive sheet which serves as a relatively strong and elastic leading part when the photoreceptive sheet is set at the initial stage. The photoreceptive sheet is arranged to be wound up around the outer peripheral surface of the wind-up shaft 36 through many rollers 38 and the upper pressing roller 33.

Meanwhile, at the right side inside the main body 21 of the image forming apparatus, a paper supply unit 41 is provided which is constituted by paper cassettes 42 and 43 and, paper supply rollers 44 and 45. Each of the paper cassettes 42 and 43 accommodates an image receiving sheet 46a or 46b therein. The image receiving sheet 46a or 46b is coated with a developing material which reacts with the colorless dyes contained in the microcapsules to develop colors. A colorless thermoplastic resin may be further coated on the surface of the image receiving sheet so that the image can be lustered. The image receiving sheet 46a or 46b is supplied one by one from the uppermost sheet in the paper cassette 42 or 43 by the rotation of the paper supply roller 44 or 45, respectively. Subsequently, the paper is sent out along a transfer passage from the paper supply unit 41 via the pressing unit 31 to a paper discharging tray 57 provided at the left side of the main body 21. In the transfer passage are provided a transfer roller 51, guide elements 52 and 54, a transfer belt 53, a heat roller 55 and a discharge roller 56.

Moreover, a suspension roller 78 is supported between an exposure unit 90 and the pressing unit 31, moving in I direction or J direction while suspending the photoreceptive sheet 34. The driving source for the suspension roller 78 is common to that of the optical system 22, and therefore the suspension roller 78 is moved in I direction or J direction with the same speeds as a second mirror unit including the mirrors 25 and 26. It is to be noted here that the suspension roller 78 is a convex shape, having a larger diameter at the center thereof than at the opposite ends thereof, so that the photoreceptive sheet 34 can be prevented from meandering.

In the image forming apparatus having the abovedescribed construction, the image receiving sheet 46a or 46b is supplied from the paper supply unit 41 to the pressing unit 31, and at the same time the light source 23 and the mirrors 24–26 are moved in G direction under the platform 29. When a first mirror unit 62 including the light source 23 and the mirror 24 is moved with V1 velocity, the second mirror unit 61 is arranged to be moved with V1/2 velocity and the suspension roller 78 is arranged to be moved with V1/2 velocity. In other words, the scanning speed of the original is arranged to be equal to the moving speed of the photoreceptive sheet 34 in the exposure unit 90. At this time, an image of the original is irradiated by the light source 23, and the reflected light is, as shown by one-dot chain line in FIG. 2, distributed onto the surface of the photoreceptive sheet 34 in the exposure unit 90 through mirrors 24–27 and the lens 28. Although the supply shaft 36 is rotated simultaneously with the movement of the optical system 22, both the upper pressing roller 32 and the lower pressing roller 33 are stopped.

As described earlier, the photoreceptive sheet 34 is coated with microcapsules containing colorless dyes and photo-hardening agents. When the reflected light is distributed on the surface of the photoreceptive sheet 34, the photo-hardening agents inside the microcapsules receiving the distributed light from the optical system 22 are accordingly hardened, and the microcapsules themselves are hardened. On the contrary, the microcapsules on the other part of the surface of the photoreceptive sheet 34 not exposed by the optical system 22 are not hardened. Therefore, as a result of the exposure from the optical system 22, a hardened image of the microcapsules is formed on the surface of the photoreceptive sheet 34.

While the original is being scanned by the optical system 22, namely, the first and second mirror units 62 and 61 are moving in G direction, the suspension roller 78 is moved in I direction, but, the upper and lower pressing rollers 32 and 33 are stopped. Therefore, the photoreceptive sheet 34 on which the hardened image corresponding to the original is formed is temporarily suspended between the exposure unit 90 and the pressing unit 31 while being supported by the suspension roller 78.

After the hardened image corresponding to the original is formed in the manner as described above, when the upper and lower pressing rollers 32 and 33 are rotated at a predetermined velocity V2, the photoreceptive sheet 34 suspended between the exposure unit 90 and the pressing unit 31 are overlapped with the image receiving sheet 46a or 46b so as to be pressed between the upper and lower pressing rollers 32 and 33. At this time, the first mirror unit 62 and the second mirror unit 61 are moved in H direction respectively at V2 velocity and V2/2 velocity. Moreover, the suspension roller 78 is moved in J direction at V2/2 velocity. The wind-up shaft 36 is rotated in the wind-up direction, whereas the supply shaft 35 is stopped.

As described above, the photoreceptive sheet 34 and the image receiving sheet 46a (or 46b) are overlapped with each other, and then pressed with each other in the pressing unit 31. On this occasion, the microcapsules on the photoreceptive sheet 34 which are not hardened are broken by the pressing force and therefore the colorless dyes within the capsules start to run outside. The colorless dyes flowing out of the microcapsules react on the developing material coated on the surface of the image receiving sheet 46a (46b), thereby to develop colors. Consequently, when the image receiving sheet 46a (46b) passes through between the upper and lower pressing rollers 32 and 33, an image of the original placed on the platform 29 is formed on the surface of the image receiving sheet 46a (46b). The image receiving sheet 46a (46b) on which the image of the original is formed is guided by the transfer belt 53 to the heat roller 55 where the surface of the image of the original is lustered. This is because the image receiving sheet 46a (46b) is further coated with the thermoplastic resin in addition to the developing material, so that the thermoplastic resin is melted when the image receiving sheet 46a (46b) is passed through the heat roller 55. The heat roller 55 serves not only to luster the surface of the image, but also to accelerate the color forming reaction of the colorless dyes with the developing material. The image receiving sheet 46a (46b) is then sent forwards onto the discharge tray 57 by the discharge roller 56.

FIG. 1 is a perspective view of the optical system 22 and the suspension roller 78 of the image forming apparatus. The first mirror unit 62 including the light source 23 and the mirror 24 has a sliding member 67 provided at one end thereof, and a rotatable roller 65 at the other end thereof. Similarly, the second mirror unit 61 including the mirrors 25 and 26 has a sliding member 68 provided at one end thereof, and a rotatable roller 64 provided at the other end thereof. The sliding members 67 and 68 slide on a cylinder-shape rail 66, while the rotatable rollers 64 and 65 move on a plate-like rail 63. A pulley 69 is secured to the sliding member 68. The suspension roller 78 for holding the photoreceptive sheet 34 also has a sliding member 77 provided at one end thereof. The sliding member 77 fixed to a pulley 76 slides on a cylinder-shape rail. 88. Fixed pulleys 70-75 are secured to a frame of the main body 21 or the like, and suspended by two wires 83 and 84 as indicated in FIG. 1. The rotation of a motor 86 is transmitted to the pulley 72 via a gear unit 85. The wire 83 which is secured at one end thereof to a fitting 81, and at the other end thereof to a fitting 82 is hung over the pulleys 69, 70, 73, 72, 73 and 71 in this order. Then, the wire 83 is fixed to the sliding member 67 by a fixed means 87, and finally hung over the pulley 69 again. On the other hand, the wire 84 is secured at one end thereof to a fitting 79 and, at the other end thereof to a fitting 80. The wire 84 is hung over the pulleys 76, 74, 73, 75 and 76 in this order. Accordingly, when the motor 86 is rotated in one direction, the first and second mirror units 62 and 61 are moved in G direction. At the same time, the suspension roller 78 is moved in I direction. Meanwhile, when the motor 86 is rotated in a reversed direction, both the first and second mirror units 62 and 61 are moved in H direction, and the suspension roller 78 is moved in J direction. A detector 91 is provided so as to detect the home position of the first mirror unit 62.

Figure 3A:
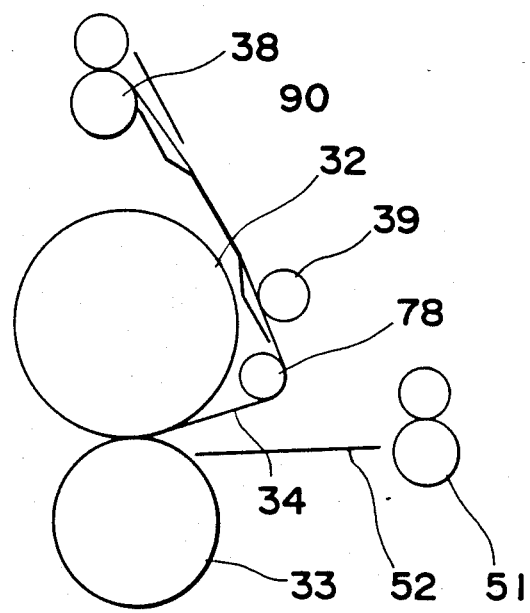
FIG. 3(a) and 3(b) are views each showing the condition of a photoreceptive sheet.
Figure 3B:
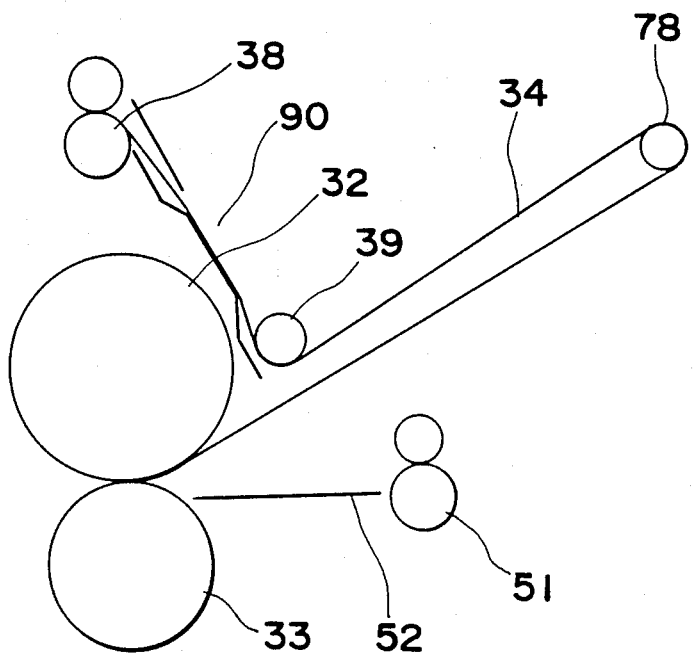

FIG. 3 (a) show how the photoreceptive sheet 34 is suspended before the original is scanned. At this time, the first and second mirror units 62 and 61 of the optical system 22 and the suspension roller 78 are located at the home position. In FIG. 3(b), how the photoreceptive sheet 34 is held after the original is scanned is indicated. In this case, the suspension roller 78 is moved to the right, while holding the photoreceptive sheet 34.

Figure 4:
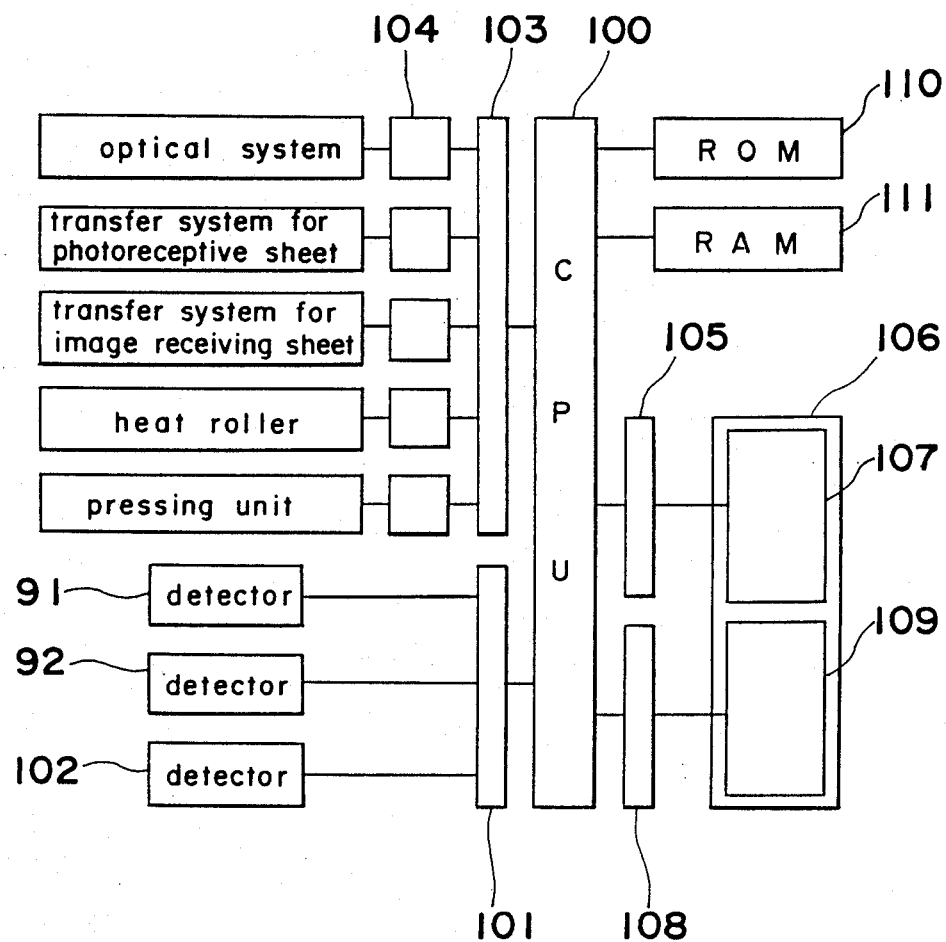
FIG. 4 is a block diagram schematically showing the structure of a control unit of the image forming apparatus.

FIG. 4 indicates the structure of a control unit of the image forming apparatus.

A signal from the detector 91 which detects, the home position of the optical system, a signal from a detector 92 which detects the rear end of the image receiving sheet when the image receiving sheet 46a (46b) has finally passed through the pressing unit 31, or a signal from the other detector 102 is inputted, through an input interface 101, to CPU 100. Drawing data in the CPU is outputted, through an output interface 103, to a driving part 104 such as the optical system, the transfer system for the photoreceptive sheet, the transfer system for the image receiving sheet, the heat roller or the pressing unit. Further, data inputted through an input interface 107 in an operating unit 106 is received by CPU 100 via an input interface 105, which data is in turn outputted as a display data to a display unit 109 via an output interface 108. CPU 100 is also connected to ROM 110 which stores sequence programs or the like to the image forming apparatus, and to RAM 111 which temporarily stores copying conditions or the like inputted from the operating unit 106.

Figure 5:
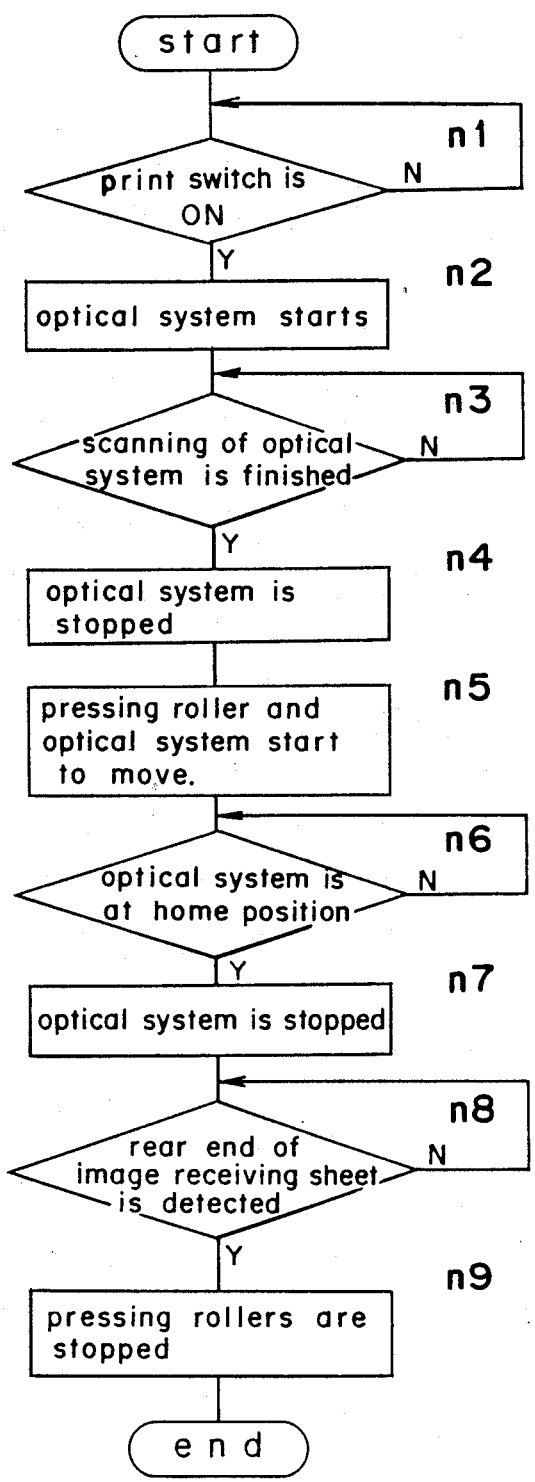
FIG. 5 is a flow-chart showing the operation sequence in the original scanning process and in the pressing and transferring process.

FIG. 5 shows a flow-chart of operations when the original is scanned and an image of the original is pressed and transferred.

When a print switch provided in the operating unit 106 is turned on in step n1, the optical system 22 starts to scan in step n2. During the scanning time of the optical system 22, the first and second mirror units 62 and 61, together with the suspension roller 78, are moved, whereas the upper and lower pressing rollers 32 and 33 are stopped. It is judged in step n3 whether the optical system 22 finishes scanning by detection of the rotating amount of the motor 86 or, the position or the moving amount of the optical system. If the scanning is finished, the optical system 22 and the suspension roller 78 are stopped moving in step n4. Then, the upper pressing roller 32 and the lower pressing roller 33 start moving in step n5, that is, start rotating. Simultaneously, the optical system 22 begins to return action so as to move back to the home position. It is needless to say that the suspension roller 78, having the common driving source with the optical system 22, starts the returning action to the home position. If it is detected by the detector 91 in step n6 that the first mirror unit 62 is returned to the home position, the optical system is stopped in step n7. Thereafter, if the detector 92 provided slightly down the pressing unit 31 detects the rear end of the image receiving sheet 46a (46b) in step n8, the upper and lower pressing rollers 32 and 33 are stopped rotating in step n9.

In the above-described sequence of operations, the original scanning operation and the pressing-transferring operation in the pressing unit 31 are arranged to be controllable independently from each other, and accordingly the original scanning speed and the pressing-transferring speed can be adjusted at respective optimum speed, resulting in the formation of an excellent image.

Accordingly, as described above, in the image forming apparatus of the present invention, the photoreceptive sheet which is exposed in the exposure unit is arranged to be temporarily suspended by the suspension roller having the common driving source with the first and second mirror units of the optical system, so that any special driving means for the suspension roller, or any synchronizing means for synchronizing the suspension roller with the optical system is dispensed with, thereby realizing such advantages as cost saving and easy design. In addition, since the pressing-transferring operation is done after the original scanning operation is finished according to the present invention, the original scanning speed and the pressing-transferring transferring speed can be controlled separately at respective optimum speed, realizing an excellent image.

Although the present invention has been fully described in connection with the preferred embodiments thereof with reference to the accompanying drawings; it is to be noted that various changes and modifications are apparent to those skilled in the art. Such changes and modifications are to be understood as included within the scope of the present invention as defined by the appended claims unless they depart therefrom.

What is claimed is:

1. In an image forming apparatus for forming a colored image of an original by forming a selective hardened image through image-making an exposure onto a photoreceptive sheet coated with microcapsules containing colorless dyes and photo-hardening agents therein, overlapping the photoreceptive sheet with an image receiving sheet coated with a developing material, and pressing the photoreceptive sheet and the image receiving sheet together to transfer the non-hardened image, thereby forming a developed color image on the image receiving sheet, comprising:

movable original scanning means for scanning and exposing an image of a static original onto the photoreceptive sheet;

transfer means for transferring the image on the photoreceptive sheet to the image receiving sheet;

suspension means, provided between said movable original scanning means and said transfer means, for suspending the photoreceptive sheet; and driving means for moving both said original scanning means and said suspension means.

2. The image forming apparatus as claimed in claim 1, wherein when the photoreceptive sheet is exposed by said movable original scanning means, the photoreceptive sheet is arranged to be temporarily suspended by said suspension means;

said driving means driving first and second mirror units located in said movable original scanning means.

3. An image forming apparatus comprising:

movable original scanning means for scanning an original and for exposing an image from the original onto a photoreceptive sheet, the scanning process being carried out by moving said original scanning means;

transfer means for transferring said image on said photoreceptive sheet to a receiving sheet;

suspension means, provided between said original scanning means and said transfer means, for suspending said photoreceptive sheet; and driving means for moving both said original scanning means and said suspension means.

4. The image forming apparatus as claimed in claim 3, wherein said photoreceptive sheet includes microcapsules, said microcapsules containing colorless dyes and photo-hardening agents.

5. The image forming apparatus as claimed in claim 3, wherein said transfer means transfers said image by pressing said photoreceptive sheet and said receiving sheet together by using rollers.

6. The image forming apparatus as claimed in claim 3, wherein said original scanning means comprises:

a first mirror; and a second mirror;

said first and second mirrors being moved by said driving means during the scanning and exposing process.

7. The image forming apparatus as claimed in claim 3, wherein said photoreceptive sheet is temporarily suspended by said suspension means when said photoreceptive sheet is being exposed.

* * * * *